(12) United States Patent
Berens et al.

(10) Patent No.: US 6,629,286 B1
(45) Date of Patent: *Sep. 30, 2003

(54) METHOD AND DEVICE FOR ASSESSING THE QUALITY OF SERVICE ON TRANSMISSION CHANNELS IN A DIGITAL TRANSMISSION SYSTEM

(75) Inventors: Friedbert Berens, Geneva (CH); Markus Doetsch, München (DE); Jörg Plechinger, München (DE); Peter Jung, Otterberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/510,639

(22) Filed: Feb. 22, 2000

Related U.S. Application Data

(63) Continuation of application No. PCT/DE98/02172, filed on Jul. 29, 1998.

(30) Foreign Application Priority Data

Aug. 22, 1997 (DE) ......................................... 197 36 653

(51) Int. Cl.$^7$ ........................... H03M 13/29; H04L 1/00
(52) U.S. Cl. ..................................... 714/755; 714/786
(58) Field of Search ................................. 714/755, 786

(56) References Cited

U.S. PATENT DOCUMENTS

| | | | |
|---|---|---|---|
| 5,214,687 A | 5/1993 | Känsäkoski et al. | |
| 6,272,183 B1 * | 8/2001 | Berens et al. | 375/262 |
| 6,370,669 B1 * | 4/2002 | Eroz et al. | 2/414 |
| 6,415,137 B1 * | 7/2002 | Hayashi | 455/70 |
| 6,430,722 B1 * | 8/2002 | Eroz et al. | 714/755 |

FOREIGN PATENT DOCUMENTS

| | | | | |
|---|---|---|---|---|
| DE | WO-99/11009 A | * | 3/1999 | H04L/1/00 |

OTHER PUBLICATIONS

Markus Naβhan et al.: :New Results on the Application of Antenna Diversity and Turbo–Codes in a JD–CDMA Mobile Radio System, PIMRC '94 and WCN, Den Haag, NL, vol. 2, Sep. 18–23, 1994, pp. 524–528.
Peter Jung: "Comparison of Turbo–Code Decoders Applied to Short Frame Transmission Systems", IEEE Journal on Selected Areas, 1996, pp. 530–537.
D. Divsalar et al.: "Turbo–Codes for BCS Applications", Icc '95, Seattle, washington, Jun. 18–22, 1995.
Claude Berrou et al.: "Near Shannon Limit Area Correction Coding: Turbo–Codes", IEEE Int. Conf. On Communications, 1993, pp. 1064–1070.
Catherine Douillard et al.: "Iterative Correction of Intersymbol Interference: Turbo–Equalization", ETT Eur. Trans. On Telecomm., vol. 6, No. 5, Oct. 1995, pp. 507–511.
Peter Jung et al.: "Applying Turbo–Codes to the Uplink in a JD–CDMA Mobile Radio System Using Coherent Receiver Antenna Diversity", ITG–Fachbericht 130, 1994, VDE–Verlag, pp. 49–56.

* cited by examiner

*Primary Examiner*—R. Stephen Dildine
(74) *Attorney, Agent, or Firm*—Laurence A. Greenberg; Werner H. Stemer; Gregory L. Mayback

(57) ABSTRACT

A quality of service on transmission channels in a digital transmission system is assessed. A turbo coding is carried out in a turbo coder at the transmitter end for channel coding. A turbo decoding is carried out in a turbo decoder with soft-decision output signals at the receiver end. The quality of service is determined from the variances of the soft-decision output signals from the turbo decoder. If a MAP (maximum a posteriori) symbol estimator is used at the receiver end, the quality of service is determined from the variance $\sigma^2_{LLR}$ of the log-likelihood ratio LLR of the soft-decision output signals from the turbo decoder. The variances $\sigma^2_{LLR}$ are used to calculate the bit error rate as a measure of the quality of service. An RCPTC (Rate Compatible Punctured Turbo Code) is used as the turbo code for the method and in the device for assessing the quality of service.

14 Claims, 5 Drawing Sheets

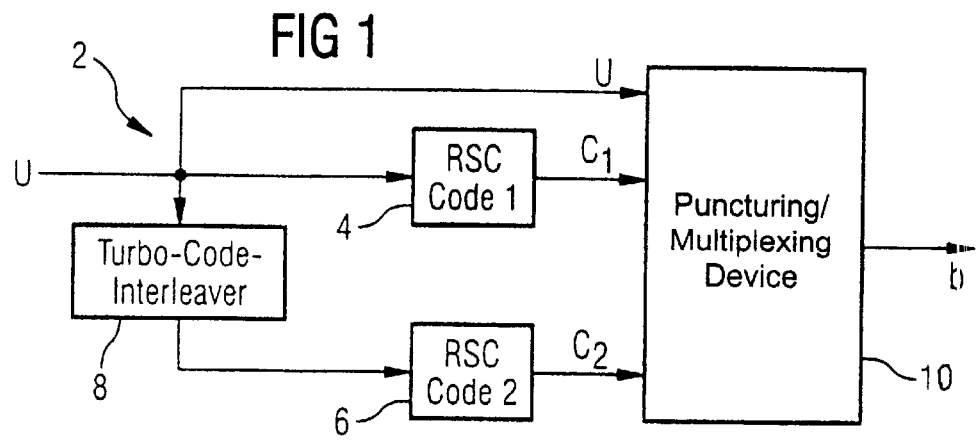
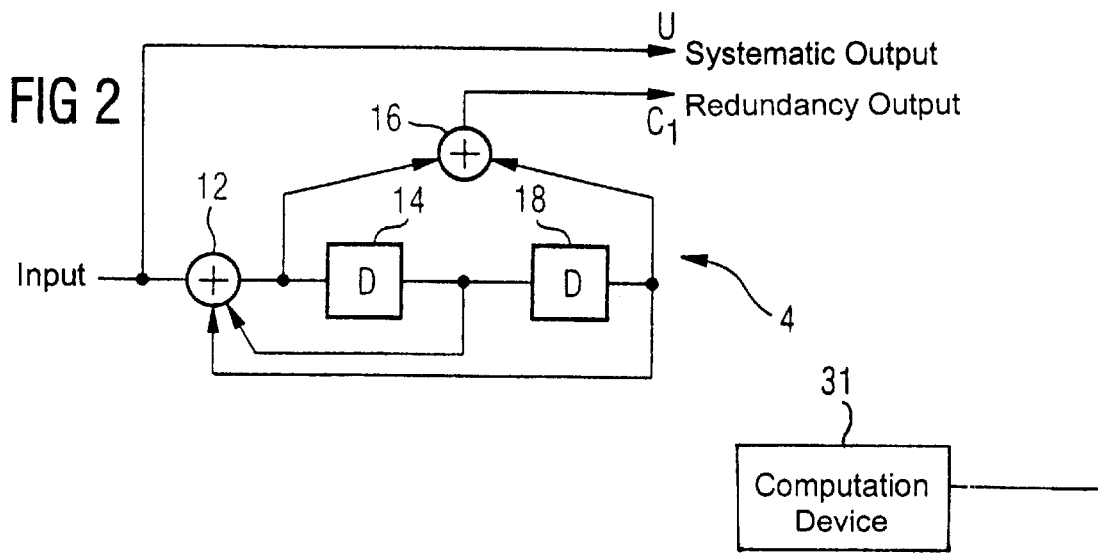
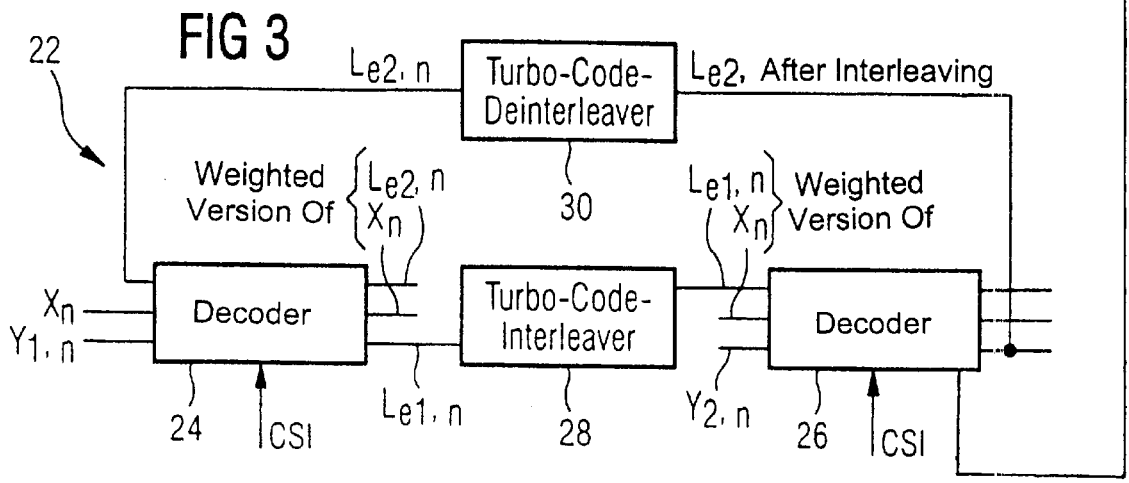

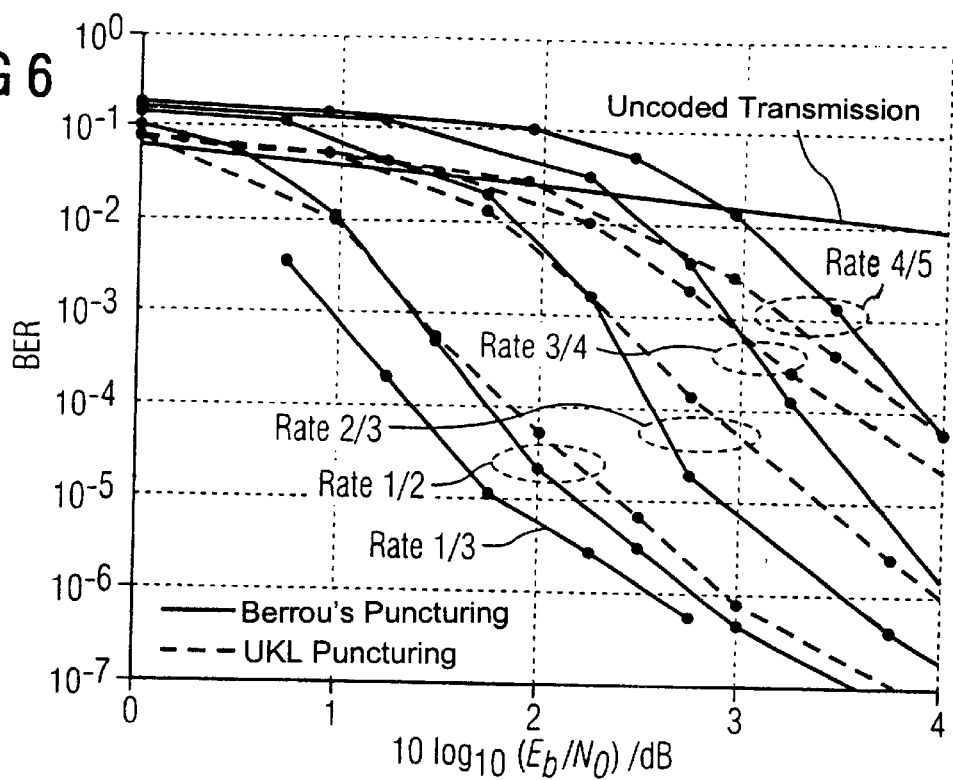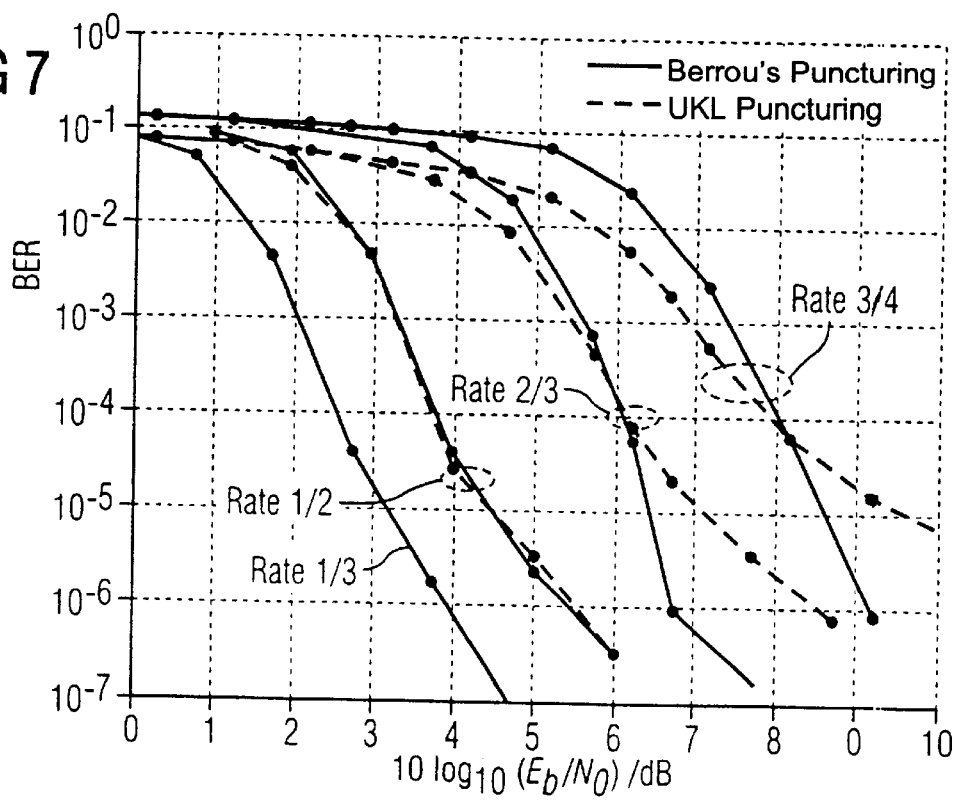

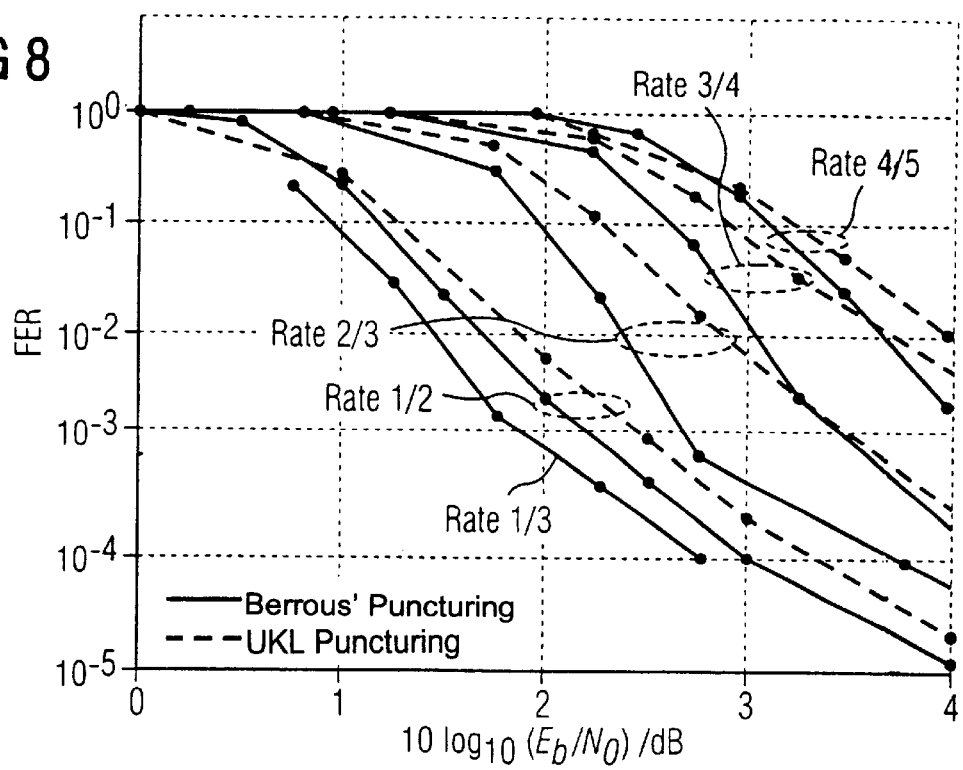
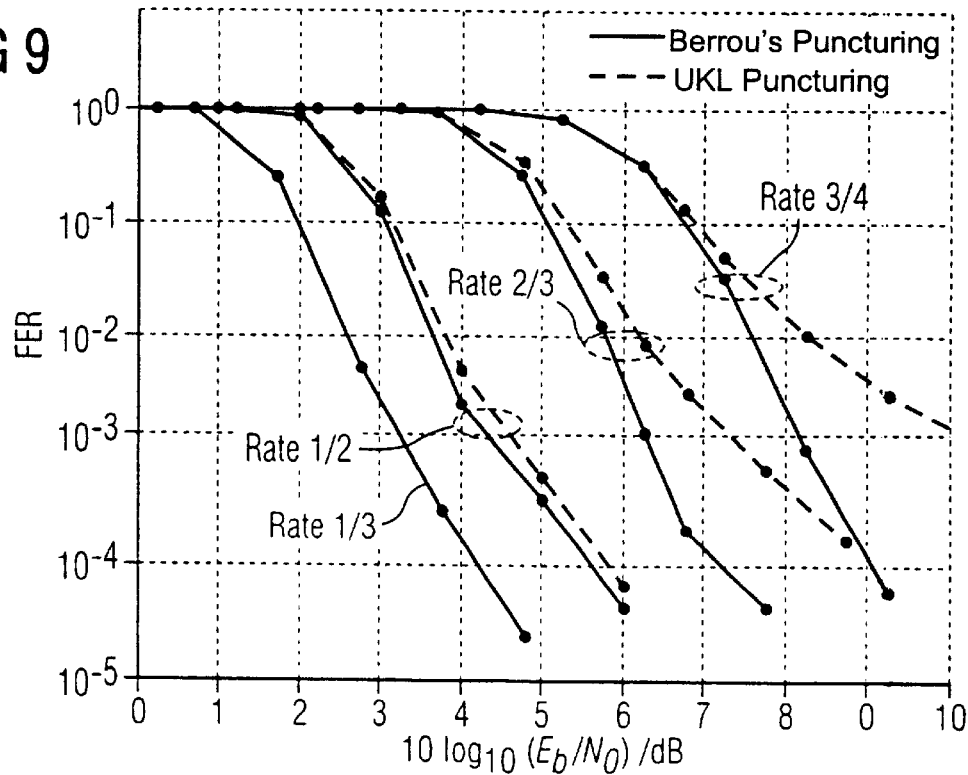

METHOD AND DEVICE FOR ASSESSING THE QUALITY OF SERVICE ON TRANSMISSION CHANNELS IN A DIGITAL TRANSMISSION SYSTEM

CROSS-REFERENCE TO RELATED APPLICATION

This application is a continuation of copending International Application PCT/DE98/02172, filed Jul. 29, 1998, which designated the United States.

BACKGROUND OF THE INVENTION

1 Field of the Invention

The invention relates to a method and a device for assessing the quality of service (QoS) on transmission channels in a digital transmission system, in which, for a channel coding, a turbo coding is carried out in a turbo coder at the transmitter end and a turbo decoding is carried out in a turbo decoder with soft-decision output signals at the receiver end.

The use of turbo codes for digital transmission systems is investigated in the article "Comparison of Turbo-Code Decoders Applied to Short Frame Transmission Systems", by P. Jung, IEEE Journal on Selected Areas in Communications, Volume 14 (1996) pages 530–537, with both coders and decoders being investigated for the turbo codes in the transmission path. Decoding of the turbo codes is based on the use of soft-input/soft-output decoders, which can be produced using either MAP (maximum a posteriori) symbol estimators or MAP sequence estimators, for example an estimator using an a-priori soft-output Viterbi algorithm (APRI-SOVA). This publication describes four different decoder configurations and their capabilities to process specific error rates. Furthermore, the performance of these decoders is investigated for different applications. It has been found that the turbo codes and their iterative decoding are an effective measure against packet errors.

In the article "Turbo Codes for PCS Applications", ICC '95, Seattle, Wash., Jun. 18–22, 1995, D. Divsalar and F. Pollara propose turbo codes to achieve an error correction virtually as far as the so-called Shannon limit. Relatively simple component codes and large interleavers are intended to be used for this purpose. In this publication, the turbo codes are produced in a coder using multiple codes, and are decoded in a suitable decoder. The turbo codes were introduced by Berrou et al. 1993 (see C. Berrou, A. Glavieux and P. Thitimayshima, "Near Shannon limit area correction coding: Turbo codes", Proc. 1993 IEE International conference on communications, pages 1064–1070). On the one hand, this method allows very good error correction to be achieved.

So-called turbo equalization is known from the article "Iterative Correction of Intersymbol Interference: Turbo-Equalization", by Catherine Douillard et al., ETT European Transactions on Telecommunications, Vol. 6, No. 5, September–October 1995. The use of turbo equalization is intended to overcome the disadvantageous effects of intersymbol interference in digital transmission systems which are protected by convolution codes. The receiver makes two successive soft-output decisions, which are made in an iterative process by a symbol detector and a channel decoder. Each iteration makes use of extrinsic information from the detector and the decoder for the next iteration, as with turbo decoding. It was found that intersymbol interference effects in multipath channels can be overcome by turbo equalization.

M. Naßhan et al. disclose in their article "New Results on the application of antenna diversity and turbo-codes in a JD-CDMA mobile radio system", 5$^{th}$ IEEE International Sysposium on Personal, Indoor and Mobile Radio Communications (PIMRC '94), and ICCC Regional Meeting on Wireless Computer Networks/WCN), The Hague, The Netherlands, Vol. 2, Sep. 18–23, 1994, pages 524–528 how assessment of the system behavior (system performance) can be achieved in a JD (joint detection) -CDMA (code division multiple access) mobile radio system by long-term averaging of the variances of the soft-decision output signals ($\sigma_{LLR}^2$) from a turbo decoder.

Future transmission systems, for example the European UMTS (Universal Mobile Telecommunications System), require the support of a large number of co-existing carrier services with carrier data rates of up to 2 Mbit/s in a flexible manner, with the best-possible spectral efficiency being desirable. An MA (Multiple Access) scheme has been developed in the ACTS (Advanced Communications Technologies and Services) project AC090 FRAMES (Future Radio Wideband Multiple Access Systems), which is called FRAMES Multiple Access (FMA) and satisfies the UMTS requirements. As a third-generation transmission system, which covers a wide range of application areas, carrier services and widely differing scenarios, FMA must comply with present and future developments of UMTS radio interface standards. FMA includes two operating modes, namely WB-TDMA (Wideband Time Division Multiple Access) with and without spreading and compatibility with GSM (Global System for Mobile Communications) and WBCDMA (Wideband Code Division Multiple Access). Although, essentially, a system based on FMA is considered here, it is also possible to include other transmission systems using multiple access methods, for example FDMA (Frequency Division Multiple Access), MC-CDMA (Multicarrier-CDMA) or combinations of the transmission systems.

With regard to the high performance of turbo codes, it is desirable to use these in digital transmission systems. The complex requirements, for example for FMA, mean, however, that it is necessary when using such turbo codes to ensure that the data transmission is not overloaded by transmission of error correction codes.

SUMMARY OF THE INVENTION

It is accordingly an object of the invention to provide a method and a device for assessing the quality of service (QoS) on transmission channels in a digital transmission system which overcome the above-mentioned disadvantages of the heretofore-known methods and devices of this general type and which do not require any additional complexity or outlay.

With the foregoing and other objects in view there is provided, in accordance with the invention, a method for assessing a quality of service on transmission channels in a digital transmission system, which includes the steps of:

performing a turbo coding in a turbo coder for a channel coding at a transmitter end;

performing a turbo decoding in a turbo decoder with soft-decision output signals at a receiver end; and determining a quality of service from instantaneous values of variances of the soft-decision output signals from the turbo decoder.

In other words, according to the invention, the method mentioned above is characterized in that the quality of service is determined from the instantaneous values of the variances of the soft-decision output signals from the turbo decoder.

In the following, the term quality of service is used as follows. Specific QoS criteria (QoS=Quality of Service) apply to various services, and the definitions of the QoS criteria for various carrier services have been worked out in the course of FRAMES. One important component of a QoS criterion is the carrier data rate R. The QoS criterion also includes a maximum permissible error rate $P_b^G$ or a packet loss rate $P_1^G$ in conjunction with a maximum failure probability $P_{out}^G$. In the case of line-switching services, the probability $P\{P_b > P_b^G\}$ of the instantaneous bit error rate $P_b$ exceeding $P_b^G$ must not be greater than $P_{out}^G$, that is to say $$Pr\{P_b > P_b^G\} < P_{out}^G$$

For voice transmission, $P_b^G$ is equal to $10^{-3}$ and $P_{out}^G$ is equal to 0.05. A similar condition for the instantaneous packet loss rate $P_1$ applies to packet services:

$$Pr\{P_1 > P_1^G\} < P_{out}^G$$

Apart from the criteria relating to Pr, there are also other conditions relating to the QoS criterion. However, the QoS parameters $P_b^G$, $P_1^G$ and $P_{out}^G$ will mainly be considered here, which relate directly to the choice of the error correction code (ECC). For the ECC, the coding rate $R_c$ is essentially governed by the multiple access method, the modulation and the packet parameters. In other words, the coding rate $R_c$ is directly related to the question as to whether a QoS criterion is or is not satisfied for a specific service.

It can be seen that determination of the quality of service in conjunction with the QoS criteria is important, wherein this determination is possible by using the method according to the invention without having to accept any additional complexity or outlay, since the variances at the receiver end can be determined without any additional information.

In a method in which a soft-input/soft-output symbol or sequence estimator is used at the receiver end, it is advantageous for the quality of service to be determined from the variances $\sigma^2$ of the soft-decision output signals from the turbo decoder, with the bit error rate advantageously being calculated from the variances $\sigma^2$, as a measure of the quality of service.

In a method in which an MAP symbol estimator or an MAP sequence estimator is used at the receiver end, it is advantageous for the quality of service to be determined from the variances $\sigma^2_{LLR}$ (LLR=log-likelihood ratios) of the soft-decision output signals from the turbo decoder.

In a method in which a Viterbi algorithm is used for a sequence estimation at the receiver end, it is advantageous for the quality of service to be determined from the variances $\sigma^2_{VIT}$ of the soft-decision output signals from the turbo decoder.

According to another mode of the invention, a Berrou's puncturing is used for puncturing only non-systematic information.

In accordance with a further mode, a UKL puncturing is used for puncturing both, systematic information and non-systematic information.

In accordance with yet another mode of the invention, the number of decoding iterations is optimized by taking into account a time delay associated with the decoding iterations and an improvement of the decoding result.

Since the method according to the invention can be used not only with MAP estimators but also for an estimation or assessment using a Viterbi algorithm, there is virtually no limitation with regard to the most important methods for sequence and symbol estimation. This is true even though this statement is specified only in conjunction with an MAP symbol estimator in the following specific description.

Furthermore, it is advantageous in the method according to the invention for an RCPTC (Rate Compatible Punctured Turbo Code) to be used as the turbo code. As can be seen from the detailed description, such a code is particularly flexible and suitable for the purposes of the invention. The RCPTC allows the transition from defined ECC strategies to flexible ECC strategies, with the latter being matched to requirements that vary with time, so that flexible linklayer control and medium access control is possible.

With the objects of the invention in view there is also provided, a device for assessing a quality of service on transmission channels in a digital transmission system, including:
  a transmitter-side turbo coder;
  a receiver-side turbo decoder, operatively connected to the turbo coder, for outputting soft-decision output signals;
  a computation device connected to the turbo decoder for calculating a quality of service from instantaneous values of variances of the soft-decision output signals from the turbo decoder.

In other words, a device for assessing the quality of service on transmission channels in a digital transmission system having a turbo coder at the transmitter end and having a turbo decoder at the receiver end, which emits soft-decision output signals, is characterized by a computation device which calculates the quality of service from the instantaneous values of the variances of the soft-decision output signals from the turbo decoder in order to carry out the method described above.

In accordance with an advantageous feature of the invention, the turbo coder has two parallel-connected RSC coders, an interleaver which is connected upstream of one of the RSC coders, and a puncturing/multiplexer device, to which the systematic sequences and the coded sequences from the RSC coders are supplied, and the turbo decoder has two RSC decoders, a turbo-code interleaver between one output of the first RSC decoder and one input of the second RSC decoder, as well as a turbo-code deinterleaver between one output of the second RSC decoder and one input of the first RSC coder. This configuration of the turbo coder and of the turbo decoder represents a simple solution for these two components, wherein the solution is adequate for most applications and wherein the RCPTC that is produced satisfies all the requirements.

In accordance with another feature of the invention, the puncturing/multiplexer device carries out a puncturing using the so-called Berrou's puncturing process, in which only the non-systematic information is punctured. This type of puncturing is advantageous if the signal-to-noise ratio values are relatively low.

A further advantageous embodiment of the device according to the invention is characterized in that the puncturing/multiplexer device carries out a puncturing using the UKL (UKL=University Kaiserslautern) puncturing process, in which both the systematic information and the non-systematic information are punctured. This type of puncturing is advantageous for higher signal-to-noise ratios, and thus for bit error rates of $<10^{-4}$.

In accordance with a further feature of the invention, the number of decoding iterations in the turbo coder is optimized taking into account the time delay, associated with this, and the improvement of the decoding result.

In accordance with an advantageous mode of the invention, the so-called Berrou's puncturing is used for puncturing, in which only the non-systematic information is punctured.

In accordance with another advantageous mode of the invention, a so-called UKL puncturing is used for puncturing, in which both, systematic information and non-systematic information are punctured.

In accordance with yet another advantageous mode of the invention, the number of decoding iterations is optimized taking into account the time delay, associated with this, and the improvement of the decoding result.

The two above-mentioned puncturing methods and the optimization of the number of decoding iterations are advantageously used to allow the assessment of the quality of service on the transmission channels to be carried out with greater confidence.

Other features which are considered as characteristic for the invention are set forth in the appended claims.

Although the invention is illustrated and described herein as embodied in a method and a device for assessing the service quality of transmission channels in a digital transmission system it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a turbo coder;

FIG. 2 is a block diagram of an RSC coder, as is used in a turbo coder as shown in FIG. 1;

FIG. 3 is a block diagram of a turbo decoder;

FIG. 6 is a graph of the performance of an RCPTC in an AWGN channel as a function of different coding rates;

FIG. 7 is a graph of the performance of an RCPTC in a Rayleigh channel as a function of different coding rates;

FIG. 8 is a graph of the performance of an RCPTC in an AWGN channel for different coding rates;

FIG. 9 is a graph of the performance of an RCPTC in a Rayleigh channel for various coding rates;

DESCRIPTION OF THE PREFERRED EMBODIMENTS

Figure 4:
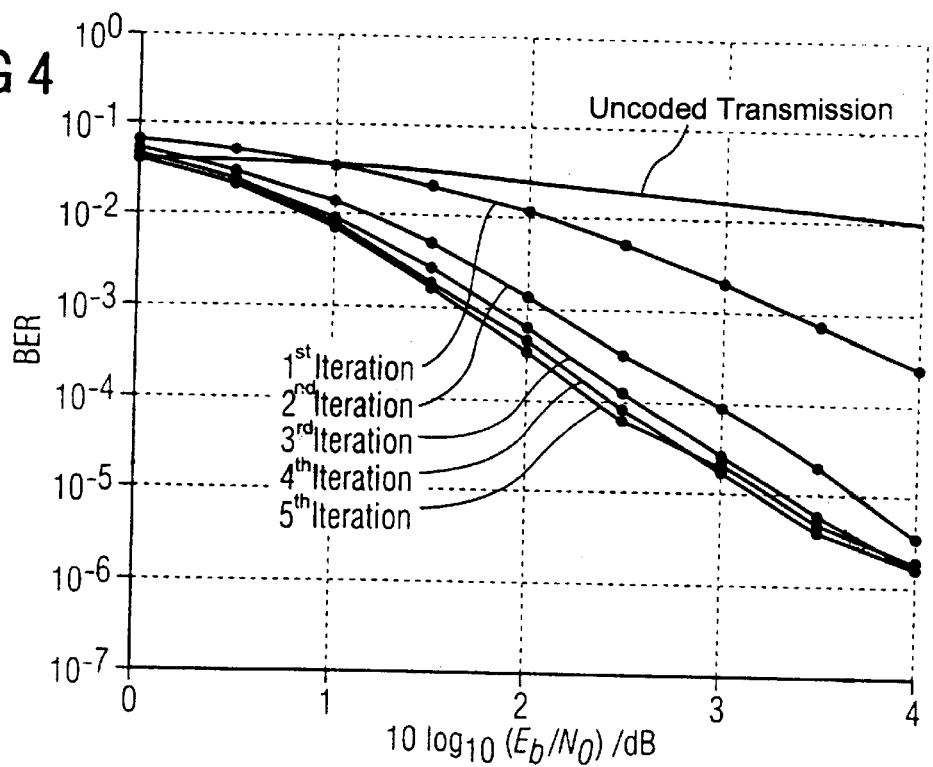
FIG. 4 is a graph of the performance of an RCPTC in an AWGN channel as a function of the number of iterations of turbo decoding.

Referring now to the figures of the drawings, the invention is described in more detail. With regard to an economic use of the hardware, the ECC (error correction code) circuit should be usable as universally as possible, while the ECC configuration should allow a high flexibility and adaptability using software control. The RCPTC (Rate Compatible Punctured Turbo Code) used here allows this, since it has the necessary flexibility. The RCPTC can be produced using the turbo coder 2 shown in FIG. 1. The turbo coder 2 has $N_e=2$ binary, recursive, systematic convolution coders 4, 6 (RSC) with a small constraint length, for example between 3 and 5, which are connected in parallel using a turbo interleaver 8. The input sequence u is supplied to the coder 4 (RSC, Code 1) and, via the turbo code interleaver 8, to the coder 6 (RSC, Code 2) as well as to a puncturing/multiplexer device 10. The puncturing/multiplexer device receives a further input $c_1$ from the coder 4 and a further input $c_2$ from the coder 6. The output of the puncturing/multiplexer device 10 is the output sequence b.

In the turbo coder 2, the minimum code rate $R_{c,min}$ is equal to $1/(N_{e+1})=1/3$. The minimum coding rate $R_{c,min}$ could be further reduced by using additional RSC coders.

The binary input sequence u, which has a finite time duration, is entered in the coder 4, at whose output it produces the redundant sequence $c_1$ with the same finite duration as u. The sequence $u_I$, which represents the sequence u after interleaving, is passed to the coder 6. The coding in the coder 6 results in the redundant sequence $c_2$. The redundant sequences $c_1$ and $c_2$ and the sequence u are punctured and multiplexed, in order to form the output sequence b. The turbo coder is a systematic coder, with u being the basis of the systematic information contained in b.

An RSC coder, as can be used for the coders 4 and 6, is shown in FIG. 2, using the example of the coder 4. The sequence u is applied as systematic information to one input of the coder 4. The sequence u passes via an addition element 12 to a delay stage 14 and to a further addition element 16. The output signals from the delay stage 14 pass to a second delay stage 18 and to the addition element 12. The output signals from the second delay stage 18 pass to the addition stage 12 and to the addition stage 16. The output from the addition stage is then the redundant sequence $c_1$.

The hardware costs are a factor in the choice of this coder, and should be kept as low as possible. For this reason, the two RSC coders for use in the context of FRAMES are identical and have a constraint length of 3. Although these RSC coders have only four states, their performance is good when the values of the signal-to-noise ratio $E_b/N_0$ are low. The performance of the RCPTC using these coders is thus advantageous at low signal-to-noise ratios.

The output sequence b of the turbo coder 2 passes via the transmission channel and a demodulator to the turbo decoder 22 (FIG. 3), which has an RSC decoder 24 and a second RSC decoder 26. A turbo code interleaver 28 is provided between one output of the decoder 24 and one input of the decoder 26. A turbo code deinterleaver 30 is provided between one output of the decoder 26 and one input of the decoder 24. The decoders 24, 26 are soft-input/soft-output decoders. A computation device 31 is connected to the turbo decoder.

A demodulator supplies estimated values $x_n$ of the systematic information $u_n$ which is contained in u, as well as estimated values $y_{1,n}$ and $Y_{2,n}$ of the transmitted redundant bits, which have been produced by the coders 4 and 6, respectively. The two decoders 24, 26 require channel state information (CSI), which includes the instantaneous signal amplitudes and the noise variance. Each of the decoders 24, 26 processes the systematic information, the redundant and a-priori information $L_{e1,n}$ and $L_{e2,n}$ while processing the CSI, as a result of which the extrinsic information $L_{e2,n}$ and $L_{e1,n}$ is produced, which is then used as a-priori knowledge in the downstream decoder. The decoding process is iterative, and the result of the decoding process is improved with each iteration. However, the amount of improvement gradually decreases with further iterations. After a certain number of iterations, the output signal from the turbo decoder 22 is supplied to a detector, as is normal for such transmission systems.

In order to match the use of the RCPTC to the existing service requirements, it would be conceivable to adapt the RSC coders, but this would lead to an undesirable additional load with regard to the hardware costs. The matching of the interleaver size to the specific services is known per se and is also a problem when using an RCPTC, owing to its flexibility.

Furthermore, the number of iterations for decoding can be set in accordance with the QoS criterion, taking account of the overall coding complexity. There are two options at the receiver for utilizing this characteristic of the turbo code. For a given QoS criterion, the number of iterations can be increased as the signal-to-noise ratio $E_b/N_0$ rises. This is particularly advantageous in fading channels, for example in transmission channels. On the other hand, the number of iterations can also be varied with a QoS criterion that changes with time. The capability to adjust the number of decoding iterations is available only when using turbo codes, in particular an RCPTC.

A further option for improving the performance in a system with an RCPTC is to set the puncturing so that an RCPTC with varying code rates $R_{c,min} <= R_c <= R_{c,max}$ can be provided, by which the coding characteristics can be changed, without changing the turbo code interleavers or RSC coders.

In principle, the sequences u, $c_1$ and $c_2$ are available for puncturing. If two of the sequences are completely suppressed by puncturing, the maximum code rate $R_{c,max}=1$ is assumed. In this case, the coding characteristics depend on which of the sequences are punctured. If, for example, the redundant sequences $c_1$ and $c_2$ are completely punctured, with only the sequence u being passed through unchanged, no ECC is available and time diversity gains cannot be achieved in receivers for fading channels. In this situation, the turbo decoder is reduced to a simple threshold-value detector.

If one of the redundant sequences $c_1$ or $c_2$ is completely suppressed by the puncturing process, in which case only the second redundant sequence together with the sequence u can pass through, the turbo coder becomes a conventional RSC coder. The turbo decoder is reduced to an RSC decoder, which is configured to carry out half an iteration. In this case, there is no a-priori knowledge based on extrinsic information. The coding rate $R_c$ may be varied between ½ and 1, depending on the QoS criterion. Since $N_e=2$, the RSC coders can be based on two different codes, and the QoS criterion and the coding complexity can be varied by suppressing a specific redundant sequence $c_1$ or $c_2$, without changing the coding rate $R_c$.

However, the options mentioned above prevent turbo code operation, which is available only when bits of the two redundant sequences $c_1$ and $c_2$ are transmitted and $$u_n \neq u_{1,n}$$

where $U_n$ and $u_{1,n}$ are contained in u and $u_1$, respectively. In this case $$R_{c,min} <= R_c < 1$$

The minimum coding rate $R_{c,min}=1/(N_e+1)$ is achieved if no puncturing is carried out. In this case, either the conventional RSC decoding or turbo decoding may be provided, depending on the QoS criterion and transmission channel state, with both factors varying with time for transmission applications.

The following versions are possible for a real turbo code operation. The sequence u is not punctured, the redundant sequences $c_1$ and $c_2$ are partially punctured. In this case, operation as RSC code or as turbo code is possible, the number of decoding iterations can be adjusted, and the coding rate may be between ⅓ and 1. This type of puncturing is called Berrou's puncturing.

An alternative option is for the sequence u and the redundant sequences $c_1$ and $c_2$ to be partially punctured. In this case, an operation with the RSC code is impossible, and is possible only with a turbo code. The number of decoding iterations can be adjusted, and the coding rate may be between ⅓ and 1. This type of puncturing is called UKL puncturing (UKL=University Kaiserslautern). Finally, the situation may also be considered in which no puncturing takes place. In this case, operation with an RSC code and a turbo code is possible. The number of decoding iterations can be adjusted, and the coding rate is around ⅓.

The advantageous feature of RCPTC is the capability to vary the coding rate $R_c$ adaptively, in which case, with an ARQ, the required information can be transmitted without having to transmit the entire, coded packet. It is sufficient to transmit an additional part of the information, which compensates for the difference in the coding rate.

Now that the options for adaptation of the coding in the case of RCPTC have been described, the effects of the matching options or adaptation options on the performance of the system using RCPTC will be described, on the basis of simulations.

FIG. 4 shows the performance of the RCPTC as a graph showing the bit error rate BER plotted against the signal-to-noise ratio $E_b/N_0$ for voice transmission via an AWGN (AWGN=additive white Gaussian noise) channel. The packet size was 150 bits, and the coding rate was roughly ⅓. The carrier data rate for voice transmission was 8 kbit/s. The uncoded transmission is shown as a reference line. The parameter for these simulations is the number of decoding iterations, which varies between 1 and 5. After the first decoding iteration, the minimum signal-to-noise ratio which is required to achieve a bit error rate of $<10^{-3}$ is approximately equal to 3.5 dB. After the second decoding iteration, approximately 1.3 dB less is required. The next decoding iteration allows a further gain of 0.2 dB. The next iteration allows gains of less than 0.1 dB. After five iterations, the minimum signal-to-noise ratio which is required for a bit error rate of less than $10^{-3}$ is approximately equal to 1.8 dB. It can thus be seen that the performance improvement becomes less as the number of iterations increases. By comparison, a conventional NSC (non systematic convolutional) code with a constraint length of 9 requires approximately 1.9 dB to achieve the same bit error rate of $<10^{-3}$. The RCPTC is thus somewhat more powerful than conventional codes, even with packet sizes as small as 150 bits.

Figure 5:
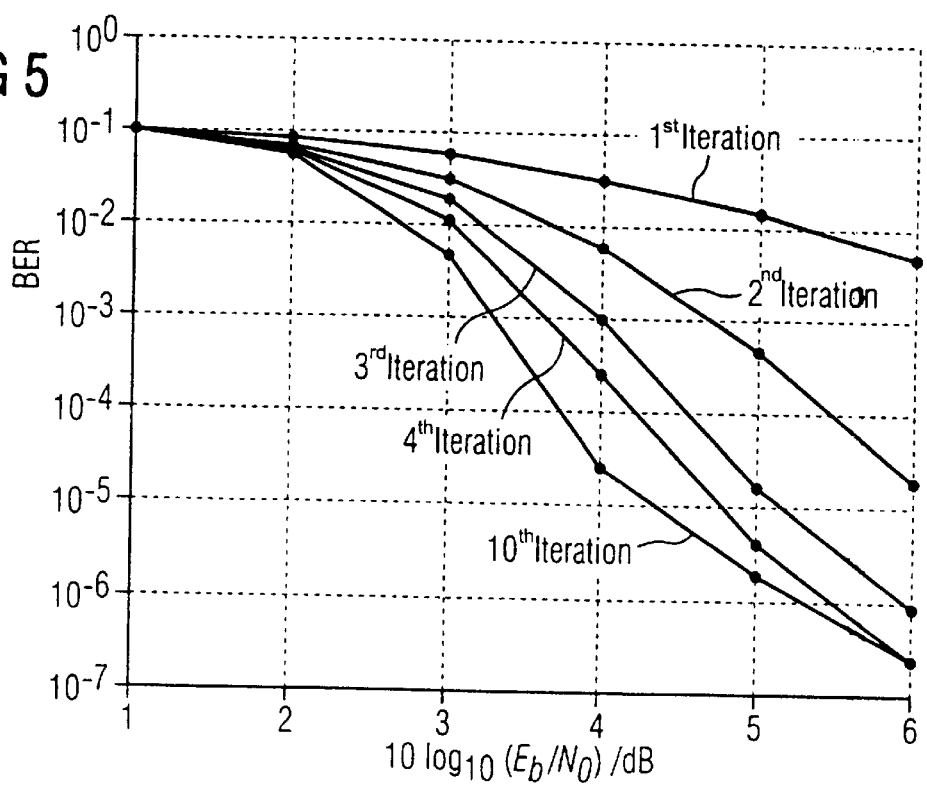
FIG. 5 is a graph of the performance of an RCPTC in a Rayleigh channel for different numbers of iterations of turbo decoding.

FIG. 5 shows a graph of the performance of the RCPTC, in which the bit error rates BER are plotted against the signal-to-noise ratio $E_B/N_0$ for narrowband ISDN (Integrated Services Digital Network) with a carrier data rate of 144 kbit/s, a packet size of 672 bits, a code rate of about ½ and a Rayleigh fading channel which is completely subjected to interleaving. The simulation parameter is once again the number of decoding iterations. After four decoding iterations, a bit error rate of less than $10^{-3}$ requires a minimum signal-to-noise ratio of 3.8 dB. Only about 3.4 dB is still required after ten iterations. A conventional NSC code with a decoding complexity similar to that of four decoding iterations has a constraint length of 8, and requires a signal-to-noise ratio that is 1.1 dB greater.

FIGS. 6 to 9 are graphs of the performance when using the RCPTC, with the bit error rate BER or the frame error rate FER, respectively, being plotted against the signal-to-noise ratio $E_B/N_0$. FIG. 6 shows the bit error rate plotted against the signal-to-noise ratio for a packet size of 672 bits, ten decoding iterations and one AWGN channel. FIG. 7 shows the bit error rate plotted against the signal-to-noise ratio for a packet size of 672 bits, ten decoding iterations and a Rayleigh fading channel which is completely subjected to interleaving. FIG. 8 shows the frame error rate FER plotted against the signal-to-noise ratio for a packet size of 672 bits, ten decoding iterations and one AWGN channel. FIG. 9 shows the frame error rate plotted against the signal-to-noise ratio for a packet size of 672 bits, 10 decoding iterations and a Rayleigh fading channel which is completely subjected to interleaving. The graphs in FIGS. 6 to 9 use two different puncturing methods, namely Berrou's puncturing and UKL puncturing, which have been mentioned above. As can be seen, Berrou's puncturing has better performance for lower values of the signal-to-noise ratio, while UKL puncturing is advantageous for a high signal-to-noise ratio, and thus for bit error rates of <$10^{-4}$. The intersections move in the direction of lower bit error rates as the coding rates increase.

Figure 10:
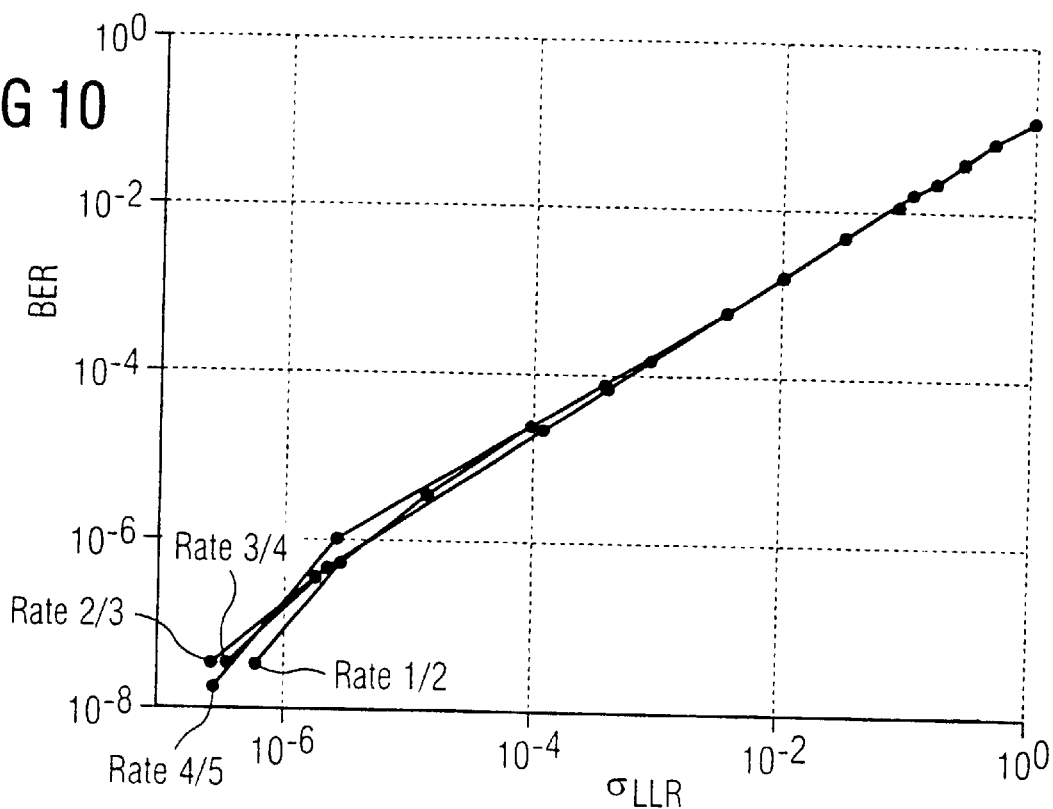
FIG. 10 is a graph of the relationship between the bit error rate BER and the variance $\sigma^2_{LLR}$ of the output of the second decoder.

In FIG. 10, the bit error rate is plotted against the variance of the log-likelihood ratios (LLR) at the output of the second decoder, with an RCPTC, a packet size of 372 bits, ten decoding iterations and one AWGN channel being assumed. It can be seen from FIG. 10 that the coding rate has no effect on the relationship between the bit error rate and the variance $\sigma^2_{LLR}$, since these two variables are similarly dependent on the signal-to-noise ratio $E_B/N_0$. Thus, if $\sigma^2_{LLR}$ is known, the bit error rate can easily be estimated, and the result of this estimation can be used as a basis for an action, for example for adaptation of the number of decoding iterations or adaptation of the coding rate in order to improve the transmission quality or, in the case of ARQ, to request a repeat transmission of an incorrectly coded packet.

Figure 11:
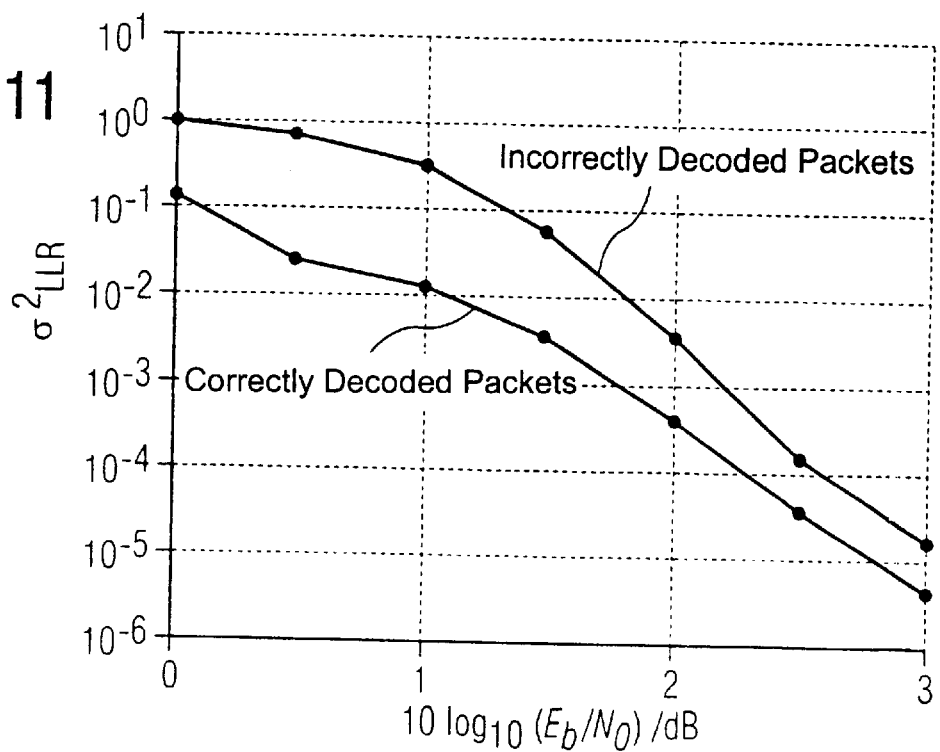
FIG. 11 is a graph of the variance $\sigma^2_{LLR}$ plotted against the signal-to-noise ratio for incorrectly and correctly decoded packets.

Finally, FIG. 11 shows the variance $\sigma^2_{LLR}$ of the log-likelihood ratio LLR of the output of the second decoder plotted against the signal-to-noise ratio $E_B/N_0$ when using an RCPTC with a packet size of 600 bits, a code rate of about ⅝, ten decoding iterations and one AWGN channel. The RCPTC was configured for a 64 kbit/s carrier or bearer service. From FIG. 11, it can be seen that a similar consideration to that in connection with FIG. 10 also applies to the dependency of the variance $\sigma^2_{LLR}$ on the occurrence of packet errors. The variance $\sigma^2_{LLR}$ for incorrectly decoded packets is always greater than $\sigma^2_{LLR}$ for correctly decoded packets. Thus, if the signal-to-noise ratio $E_B/N_0$ and $\sigma^2_{LLR}$ are known for a packet which is currently being checked, a soft-decision variable, which is related to the probability of a packet error, can easily be produced and used for control purposes.

Although the present description relates mainly to a use of the invention with digital mobile telephones, the invention is not limited to this but can in general be used with the mentioned advantages for digital transmission systems, for example line based systems, optical transmission systems (infrared and laser transmission systems), satellite radio systems, deep-space transmission systems, radio-link transmission systems and broadcast-radio transmission systems such as digital radio or television.

We claim:

1. A method for assessing a quality of service on transmission channels in a digital transmission system, the method which comprises:
   performing a turbo coding in a turbo coder for a channel coding at a transmitter end;
   performing a turbo decoding in a turbo decoder with soft-decision output signals at a receiver end; and
   determining a quality of service from instantaneous values of variances of the soft-decision output signals from the turbo decoder.

2. The method according to claim 1, which comprises:
   using one of a soft-input/soft-output symbol estimator and a soft-input/soft-output sequence estimator at the receiver end; and
   determining the quality of service from the variances $\sigma^2$ of the soft-decision output signals from the turbo decoder.

3. The method according to claim 2, which comprises calculating a bit error rate from the variances $\sigma^2$ as a measure of the quality of service.

4. The method according to claim 2, which comprises:
   using one of a MAP symbol estimator and a MAP sequence estimator at the receiver end; and
   determining the quality of service from the variances $\sigma^2_{LLR}$ of the soft-decision output signals from the turbo decoder.

5. The method according to claim 2, which comprises:
   using a Viterbi algorithm for a sequence estimation at the receiver end; and
   determining the quality of service from the variances $\sigma^2_{VIT}$ of the soft-decision output signals from the turbo decoder.

6. The method according to claim 1, which comprises using a Berrou's puncturing for puncturing only non-systematic information.

7. The method according to claim 1, which comprises using a UKL puncturing for puncturing both, systematic information and non-systematic information.

8. The method according to claim 1, which comprises optimizing a number of decoding iterations by taking into account a time delay associated with the decoding iterations and an improvement of a decoding result.

9. The method according to claim 1, which comprises using a RCPTC as a turbo code.

10. A device for assessing a quality of service on transmission channels in a digital transmission system, comprising:
    a transmitter-side turbo coder;
    a receiver-side turbo decoder, operatively connected to said turbo coder, for outputting soft-decision output signals;
    a computation device connected to said turbo decoder for calculating a quality of service from instantaneous values of variances of the soft-decision output signals from said turbo decoder.

11. The device according to claim 10, wherein:
    said turbo coder has two parallel-connected RSC coders, an interleaver connected upstream of one of said RSC coders, and a puncturing/multiplexing device;
    said puncturing/multiplexing device is supplied with systematic sequences and coded sequences from said RSC coders; and
    said turbo decoder has a first RSC decoder and a second RSC decoder, a turbo-code interleaver connected between an output of said first RSC decoder and an input of said second RSC decoders, and a turbo-code deinterleaver connected between an output of said second RSC decoder and an input of said first RSC decoder.

12. The device according to claim 11, wherein said puncturing/multiplexing device performs a puncturing using a Berrou's puncturing, said puncturing/multiplexing device puncturing only non-systematic information.

13. The device according to claim 11, wherein said puncturing/multiplexing device performs a puncturing using a UKL puncturing, said puncturing/multiplexing device puncturing both, systematic information and non-systematic information.

14. The device according to claim 10, wherein said turbo decoder performs a number of decoding iterations, the number of decoding operations being optimized by taking into account a time delay associated with said decoding iterations and by taking into account an improvement of a decoding result.

* * * * *